US008225256B2

(12) United States Patent
Potemski et al.

(10) Patent No.: US 8,225,256 B2
(45) Date of Patent: Jul. 17, 2012

(54) METHOD AND APPARATUS FOR ACCELERATING PROJECT START AND TAPE-OUT

(75) Inventors: Andrew Stanley Potemski, Round Rock, TX (US); John Scott Tyson, Austin, TX (US)

(73) Assignee: Synopsys, Inc., Mountain View, CA (US)

( * ) Notice: Subject to any disclaimer, the term of this patent is extended or adjusted under 35 U.S.C. 154(b) by 333 days.

(21) Appl. No.: 12/423,962

(22) Filed: Apr. 15, 2009

(65) Prior Publication Data

US 2010/0235801 A1 Sep. 16, 2010

Related U.S. Application Data

(60) Provisional application No. 61/160,220, filed on Mar. 13, 2009.

(51) Int. Cl.
*G06F 17/50* (2006.01)
(52) U.S. Cl. .......................................... 716/110; 716/50
(58) Field of Classification Search .................. 716/100, 716/110, 50
See application file for complete search history.

(56) References Cited

U.S. PATENT DOCUMENTS

| | | | | |
|---|---|---|---|---|
| 5,960,184 A * | 9/1999 | Cleereman et al. | ........... | 716/102 |
| 6,637,013 B1 * | 10/2003 | Li | .................................. | 716/112 |
| 6,904,571 B1 * | 6/2005 | Schmidt et al. | ............... | 716/112 |
| 6,915,252 B1 * | 7/2005 | Li | .................................... | 703/22 |
| 2003/0237064 A1 | 12/2003 | White | | |
| 2007/0186202 A1 | 8/2007 | Liao | | |
| 2008/0010618 A1 * | 1/2008 | Watanabe | ......................... | 716/1 |
| 2008/0127020 A1 * | 5/2008 | Rittman | .......................... | 716/10 |
| 2008/0244475 A1 * | 10/2008 | Lo et al. | ............................ | 716/4 |
| 2008/0244506 A1 | 10/2008 | Killian | | |
| 2008/0295049 A1 * | 11/2008 | Izuha | ................................ | 716/5 |
| 2009/0031264 A1 * | 1/2009 | Rittman et al. | .................... | 716/5 |
| 2011/0314437 A1 * | 12/2011 | McIlrath | ....................... | 716/139 |
| 2012/0066659 A1 * | 3/2012 | Chen et al. | ..................... | 716/122 |

* cited by examiner

*Primary Examiner* — Suchin Parihar
(74) *Attorney, Agent, or Firm* — Park, Vaughan, Fleming & Dowler LLP; Laxman Sahasrabuddhe

(57) ABSTRACT

Some embodiments of the present invention provide systems and techniques that accelerate project start and tape-out. During operation, a system can receive a set of technology files and a set of libraries. Next, the system can identify deficiencies in the set of technology files and the set of libraries. The system can then construct update utilities that when executed by a computer system cause the computer system to fix the deficiencies in the technology files and the set of libraries. Further, a system can receive a set of checks that are performed by a foundry. Next, the system can construct tape-out scripts that when executed by a computer cause the computer to perform the set of checks on the circuit design. The update utilities and the tape-out scripts can then be provided to a customer with an electronic design automation software to accelerate project start and tape-out.

18 Claims, 6 Drawing Sheets

METHOD AND APPARATUS FOR ACCELERATING PROJECT START AND TAPE-OUT

RELATED APPLICATION

This application claims the benefit of U.S. Provisional Application No. 61/160,220, entitled "Method and Apparatus for Accelerating Project Start and Tape-In," by inventors Andrew Stanley Potemski and John Scott Tyson, filed 13 Mar. 2009.

BACKGROUND

1. Field

This disclosure generally relates to electronic design automation. More specifically, the disclosure relates to methods and apparatuses for accelerating project start and tape-out.

2. Related Art

Rapid advances in computing technology have made it possible to perform trillions of computational operations each second on data sets that are sometimes as large as trillions of bytes. These advances can largely be attributed to the dramatic improvements in semiconductor design and manufacturing technologies that have made it possible to integrate tens of millions of devices onto a single chip.

Integration densities continue to increase at a rapid pace to keep up with the insatiable demand for smaller, faster, and more complex electronic devices and computers. As technology nodes move to 65 nm and below, circuit designers and project managers are facing a number of new and difficult challenges. Specifically, circuit designers and project managers are finding it increasingly difficult to meet project deadlines. Hence, what are needed are systems and techniques for reducing the circuit design time and for managing the circuit design process better.

SUMMARY

Some embodiments of the present invention provide systems and techniques that accelerate project start. During operation, a system can receive a set of technology files and a set of libraries, which are intended for use with a specific semiconductor manufacturing technology. Next, the system can identify deficiencies in the set of technology files and the set of libraries. The system can then construct scripts that when executed by a computer system cause the computer system to fix the deficiencies in the technology files and the set of libraries. Next, the scripts can be provided to a customer with an electronic design automation (EDA) software. The scripts can be automatically executed by the EDA software to fix the deficiencies in the technology files and the set of libraries when the customer uses the electronic design automation software.

Some embodiments of the present invention provide systems and techniques to accelerate tape-out of a circuit design. During operation, a system can receive a set of checks that are performed by a foundry when the foundry receives a circuit design. Next, the system can construct scripts that when executed by a computer cause the computer to perform the set of checks on the circuit design. The scripts can then be provided to a customer with an EDA software. The scripts can be used to automatically perform the set of checks on the circuit design when the customer uses the EDA software to tape-out the circuit design.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit (IC) Design Flow

Figure 1:
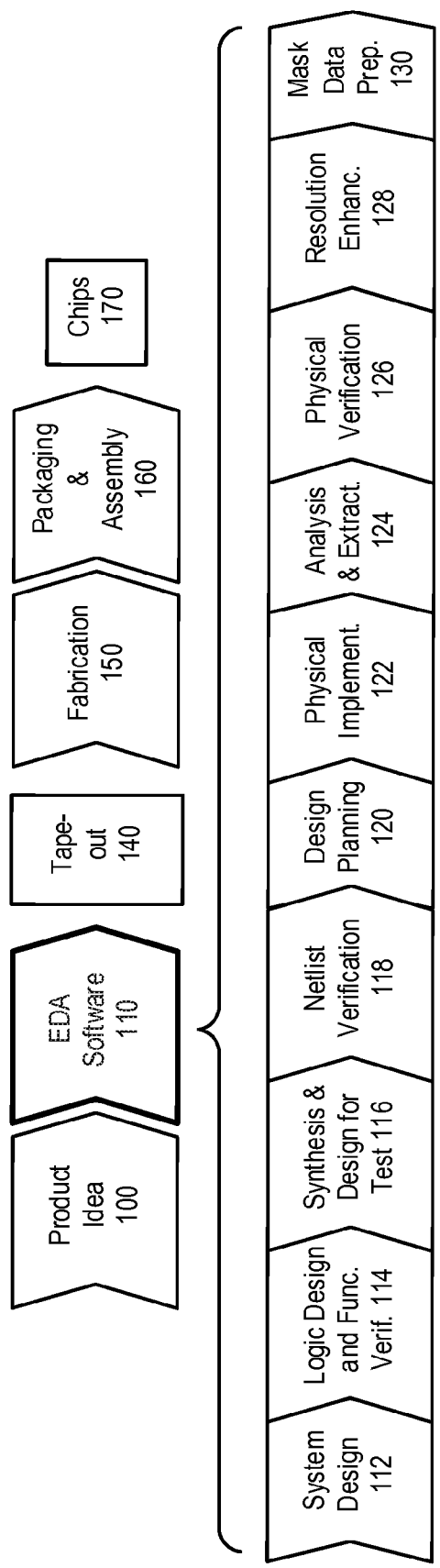
FIG. 1 illustrates various stages in the design and fabrication of an integrated circuit in accordance with an embodiment of the present invention.

FIG. 1 illustrates various stages in the design and fabrication of an integrated circuit in accordance with an embodiment of the present invention.

The process can start with a product idea (step 100) which can be realized using an integrated circuit that is designed using an EDA process (step 110). After the integrated circuit is taped-out (event 140), it can undergo a fabrication process (step 150) and a packaging and assembly process (step 160) to produce chips 170.

The EDA process (step 110) comprises steps 112-130, which are described below for illustrative purposes only and are not meant to limit the present invention. Specifically, the steps may be performed in a different sequence than the sequence described below.

During system design (step 112), circuit designers can describe the functionality that they want to implement. They can also perform what-if planning to refine functionality, check costs, etc. Hardware-software architecture partitioning can also occur at this stage. Exemplary EDA software products from Synopsys, Inc. that can be used at this step include Model Architect, Saber®, System Studio, and DesignWare®.

During logic design and functional verification (step 114), the VHDL or Verilog code for modules in the system can be written and the design can be checked for functional accuracy, e.g., the design can be checked to ensure that it produces the correct outputs. Exemplary EDA software products from Synopsys, Inc. that can be used at this step include VCS®, Vera®, DesignWare®, Magellan™, Formality®, ESP and Leda®.

During synthesis and design for test (step 116), the VHDL/Verilog can be translated to a netlist. Further, the netlist can be optimized for the target technology, and tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare®.

During netlist verification (step 118), the netlist can be checked for compliance with timing constraints and for correspondence with the VHDL/Verilog source code. Exemplary EDA software products from Synopsys, Inc. that can be used at this step include Formality®, PrimeTime®, and VCS®.

During design planning (step 120), an overall floorplan for the chip can be constructed and analyzed for timing and top-level routing. Exemplary EDA software products from Synopsys, Inc. that can be used at this step include Astro™ and IC Compiler products.

During physical implementation (step 122), circuit elements can be positioned in the layout (placement) and can be electrically coupled (routing). Exemplary EDA software products from Synopsys, Inc. that can be used at this step include Astro™ and IC Compiler products.

During analysis and extraction (step 124), the circuit's functionality can be verified at a transistor level and parasitics can be extracted. Exemplary EDA software products from Synopsys, Inc. that can be used at this step include AstroRail™, PrimeRail, PrimeTime®, and Star-RCXT™.

During physical verification (step 126), the design can be checked to ensure correctness for manufacturing, electrical issues, lithographic issues, and circuitry. Hercules™ is an exemplary EDA software product from Synopsys, Inc. that can be used at this step.

During resolution enhancement (step 128), geometric manipulations can be performed on the layout to improve manufacturability of the design. Exemplary EDA software products from Synopsys, Inc. that can be used at this step include Proteus/Progen, ProteusAF, and PSMGen.

During mask data preparation (step 130), the design can be "taped-out" to produce masks which are used during fabrication. Exemplary EDA software products from Synopsys, Inc. that can be used at this step include the CATS® family of products.

Configurable Foundry Ready System

Integration densities have increased at a rapid pace to keep up with the insatiable demand for smaller, faster, and more complex electronic devices and computers. As semiconductor technology moves to 65 nm, and further to 45/40 nm and below, circuit designers and project managers are facing a number of difficult challenges. First, circuit designers need highly advanced design techniques to design circuits at these nodes. Second, due to the complex dependency between different stages in the electronic design flow, and due to the highly sophisticated nature of the processing involved in each stage, it is very difficult for project managers to accurately measure progress and to accurately predict when a circuit design project will complete. Third, the libraries and the foundry requirements are very complicated, which causes project teams to spend large amounts of time setting up the circuit design project and then taping-out the circuit design to ensure that it meets the foundry's requirements. Fourth, it is difficult to ensure that third party circuit designs (often referred to as "IP" in the semiconductor industry) are clean and are compatible with one another. In light of the above challenges, it is not surprising that 69% of tape-outs (according to some estimates) miss their deadlines.

Some embodiments of the present invention provide customers a low risk path to move to 65 nm technologies and below. These embodiments reduce the turnaround time and improve predictability and productivity. Specifically, these embodiments provide an automated way to set up library data for electronic design automation software by providing scripts and templates to create a complete library and technology file database for use in a circuit design flow. Further, some embodiments help the customer ensure that a taped-out circuit design will meet the foundry's requirements.

A customer typically receives a set of technology files and a set of libraries. The technology files can include design rule check files and LVS (lithography versus silicon) check files. The technology files can also include information that describes the semiconductor manufacturing technology that is going to be used to manufacture the chip. During circuit design, the EDA software can use these parameter values to predict the behavior of the circuit design and to ensure that the final circuit design will manufacture properly. If a deficiency in the technology file goes unnoticed, it can cause substantial delays in the time to market. Deficiencies in the technology files can include invalid syntax, missing pieces that need to be generated, incorrect format, or incorrect unit. Hence, when a circuit design project is started, it is critical to ensure that the technology files do not have any deficiencies.

Circuit designers often use off-the-shelf circuit designs that implement low-level logic functions (e.g., an AND gate, an OR gate, etc.), macros, cells, etc. These off-the-shelf circuit designs are typically provided as a library, e.g., standard cell libraries, and can be provided by foundries or third party vendors. For example, foundries often provide memory modules to the customer. Note that libraries are supposed to speed up the circuit design process because they can prevent the circuit designers from "reinventing the wheel." However, if the libraries contain deficiencies, the project team can end up wasting precious resources trying to fix the deficiencies. Hence, before a library is used in a circuit design, it is critical to ensure that the library does not have any deficiencies.

During tape-out, a circuit design must meet a set of very stringent criteria so that the manufactured chips will behave as desired. Specifically, a foundry typically performs a large number of tests on the circuit design before accepting the circuit design for manufacturing. If the foundry determines that the circuit design does not meet its requirements, the foundry notifies the circuit designers, who then modify the circuit so that it conforms to the foundry's requirements. Unfortunately, this iterative process between the foundry and the circuit designers can cause substantial delays in the time-to-market for the circuit design. Hence, before a circuit design is taped-out and provided to a foundry for manufacturing, it is critical to ensure that the circuit design meets all of the foundry's requirements.

Unfortunately, project deadlines are often missed because of deficiencies in the technology files and the libraries, and/or because the circuit design did not satisfy a foundry requirement. Some embodiments of the present invention provide systems and techniques that help to identify deficiencies in the technology files and/or the libraries during the project start phase. Further, some embodiments enable circuit designers to ensure that the taped-out circuit design meets all of the foundry's requirements.

Figure 2A:
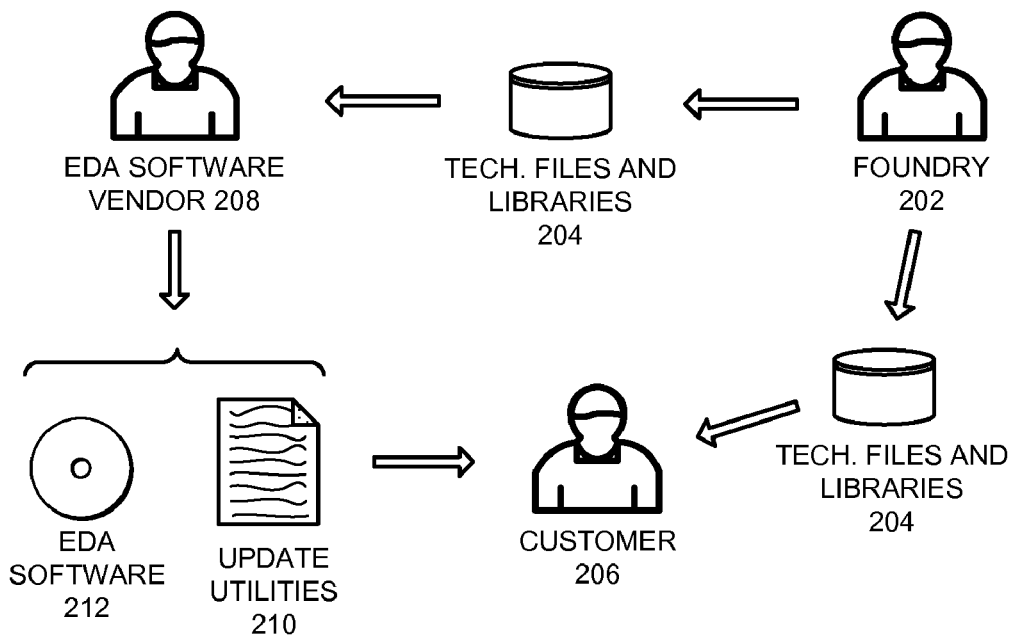
FIG. 2A illustrates how project start can be accelerated by using update utilities in accordance with an embodiment of the present invention.
Figure 2B:
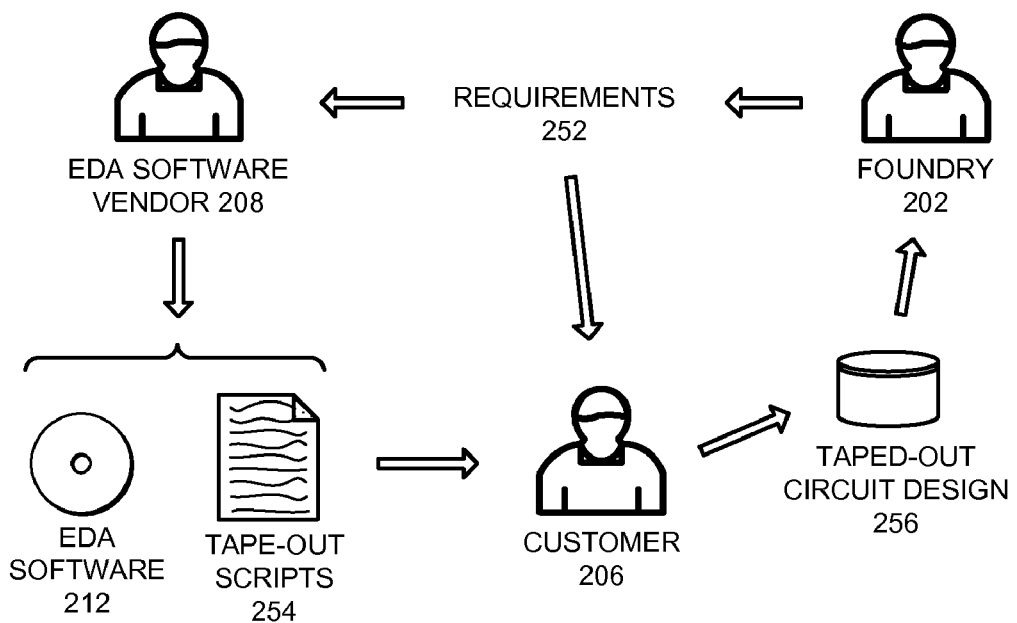
FIG. 2B illustrates how tape-out can be accelerated by performing checks during tape-out in accordance with an embodiment of the present invention.

FIG. 2A illustrates how project start can be accelerated by using update utilities in accordance with an embodiment of the present invention. (Note that FIG. 2A and FIG. 2B illustrate technology files and libraries 204 as a single object for the sake of clarity. Technology files and libraries are usually separate objects, which may be provided by different entities.)

Foundry 202 can provide technology files and libraries 204 to customer 206. Unfortunately, technology files and libraries 204 often contain deficiencies which can cause substantial delays in circuit design projects. To overcome this problem, EDA software vendor 208 can receive a copy of technology files and libraries 204. Next, EDA software vendor 208 can check technology files and libraries 204 to identify any deficiencies. EDA software vendor 208 can then construct update utilities 210 that fix the deficiencies. For example, update utilities 210 can be a set of Tcl/Tk scripts that when executed modify the technology files and libraries to fix the deficiencies. Next, EDA software vendor 208 can provide update utilities 210 with EDA software 212 to customer 206. When customer 206 uses EDA software 212, update utilities 210 can be automatically executed whenever they are required to fix deficiencies in the technology files and libraries 204.

FIG. 2B illustrates how tape-out can be accelerated by performing checks during tape-out in accordance with an embodiment of the present invention.

Foundry 202 can provide the foundry's requirements 252 to customer 206. Customer 206 can provide taped-out circuit design 256 to foundry 202, which can then perform a variety of checks. Unfortunately, the customer's circuit design often fails the checks that the foundry performs when it receives the circuit design from the customer. To overcome this problem, EDA software vendor 208 can receive the foundry's requirements 252. Next, EDA software vendor 208 can construct tape-out scripts 254 (e.g., Tcl/Tk scripts) which check whether a circuit design meets the foundry's requirements 252. EDA software vendor 208 can then provide tape-out scripts 254 with EDA software 212 to customer 206. When customer 206 uses EDA software 212, tape-out scripts 254 can be automatically executed during tape-out to ensure that the circuit design meets the foundry's requirements 252.

Accelerating Project Start

Figure 3:
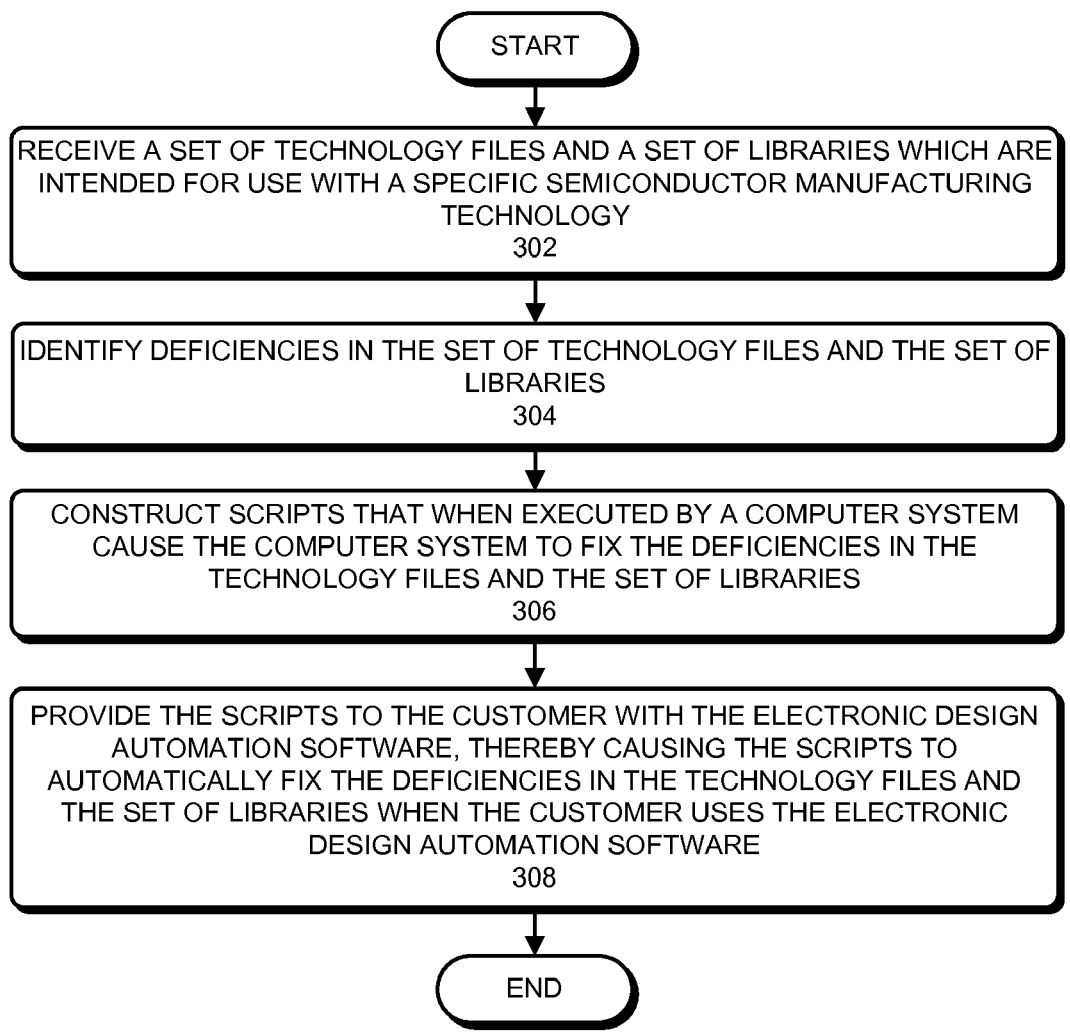
FIG. 3 presents a flowchart that illustrates a process to accelerate project start for a circuit design project which uses electronic design automation software in accordance with an embodiment of the present invention.

FIG. 3 presents a flowchart that illustrates a process to accelerate project start for a circuit design project which uses electronic design automation software in accordance with an embodiment of the present invention.

The process can begin by receiving a set of technology files and a set of libraries which are intended for use with a specific semiconductor manufacturing technology (block 302). The technology files usually describe parameters for a semiconductor manufacturing technology, and the set of libraries usually include pre-designed circuit designs. Further, the technology files are usually received from a foundry that is expected to manufacture chips based on the circuit design, and the set of libraries can be received from the foundry or a third party library vendor.

The system can then identify deficiencies in the set of technology files and the set of libraries (block 304). The libraries can include standard cells, I/O cells, and memories. A deficiency in a library can be a design rule violation. Note that the foundry creates design rules. The library vendors typically try to provide cells in the libraries so that they satisfy the design rules. However, the libraries usually contain deficiencies, e.g., design rule violations, which need to be identified and fixed before the library can be used in the circuit design process. In the absence of update utilities, this process of identifying and fixing deficiencies in the libraries and the technology files can take up a large amount of resources. Hence, the update utilities dramatically reduce the amount of time that customers need to spend on fixing such deficiencies.

Next, the system can construct scripts that when executed by a computer system cause the computer system to fix the deficiencies in the technology files and the set of libraries (block 306). Specifically, the scripts (e.g., Tcl/Tk scripts) can be constructed by configuring script templates using parameter values that are associated with a specific semiconductor manufacturing technology. The script templates can include instructions that fix the most common types of deficiencies that are found in technology files and libraries. However, to fix the technology files and/or the libraries for a particular foundry, the script templates need to be populated with parameter values that are specific to the semiconductor manufacturing technology that is used by the foundry.

The system can then provide the scripts to the customer with the electronic design automation software, thereby causing the scripts to automatically fix the deficiencies in the technology files and the set of libraries when the customer uses the electronic design automation software (block 308). Specifically, the update utilities can also automatically set up the design flow for the customer so that the libraries and technology files are fixed by update utilities before they are used by the tools in the design flow. A repair or rebuilding process may need to be performed after the update utility fixes the deficiencies in the technology files and/or libraries.

When customers receive updated technology files and libraries, it can cause new errors, e.g., DRC errors, LVS errors, timing problems, etc., in the circuit design. The update utilities can significantly accelerate solving these problems. The circuit designers are typically hard pressed to meet their own deadlines when they receive the updates, and hence, using an update to a library that can cause new errors can be very disruptive to the circuit design process. At the same time, the updated technology files and/or libraries may improve performance of the system, and hence, by not using the updated technology files and/or libraries, the circuit designers may forgo performance improvements in the chip design. By using update utilities, the circuit designers can enjoy the benefits of the updated library without worrying about errors in the library because the update utility has been specifically constructed to fix any deficiencies in the updated library.

Figure 4:
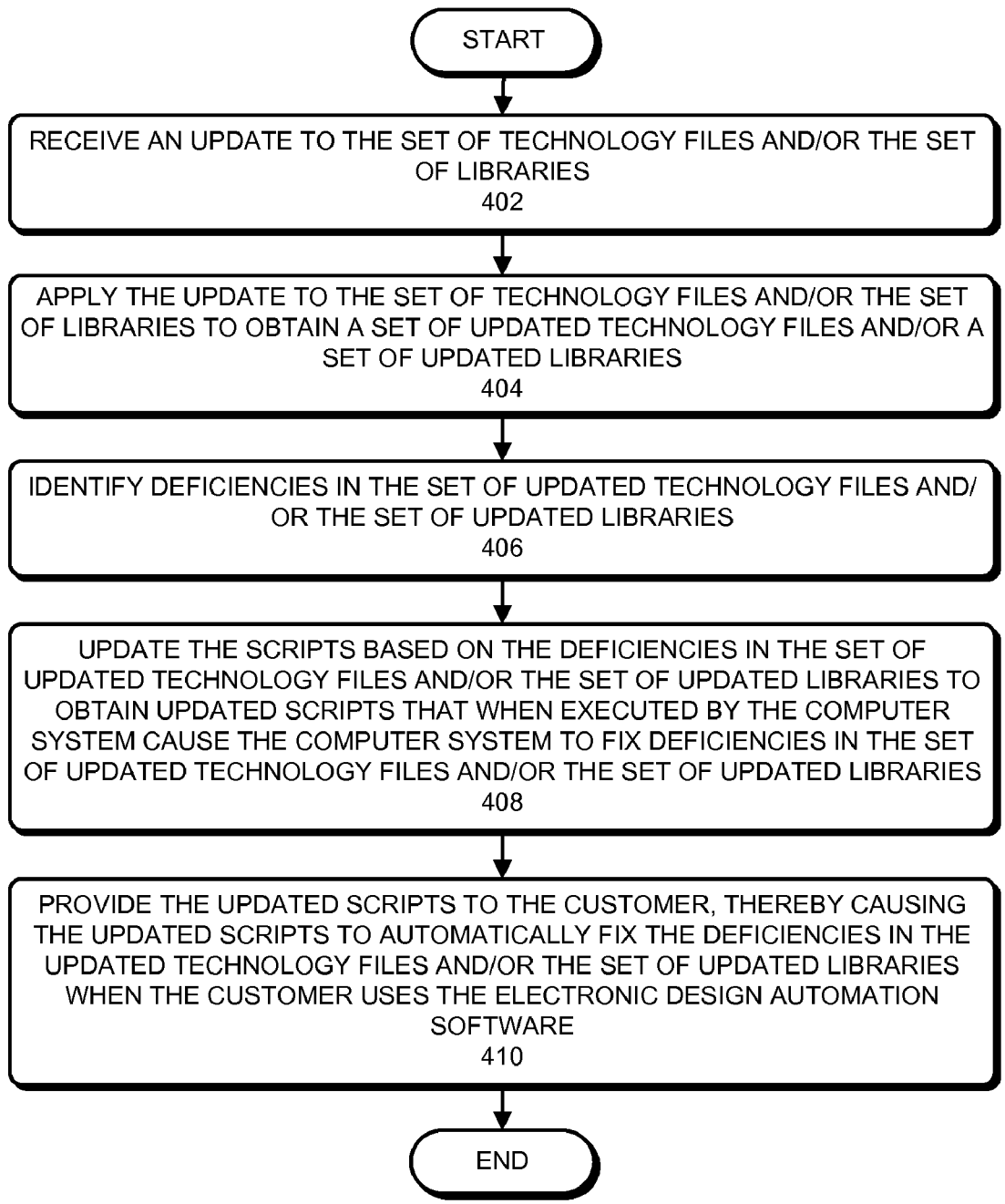
FIG. 4 presents a flowchart that illustrates how scripts can be updated in response to receiving updates for a set of technology files and/or a set of libraries in accordance with an embodiment of the present invention.

FIG. 4 presents a flowchart that illustrates how scripts can be updated in response to receiving updates for a set of technology files and/or a set of libraries in accordance with an embodiment of the present invention.

The process can begin by receiving an update to the set of technology files and/or the set of libraries (block 402).

Next, the system can apply the update to the set of technology files and/or the set of libraries to obtain a set of updated technology files and/or a set of updated libraries (block 404).

The system can then identify deficiencies in the set of updated technology files and/or the set of updated libraries (block 406).

Next, the system can update the scripts based on the deficiencies in the set of updated technology files and/or the set of updated libraries to obtain updated scripts that when executed by the computer system cause the computer system to fix deficiencies in the set of updated technology files and/or the set of updated libraries (block 408).

The system can then provide the updated scripts to the customer, thereby causing the updated scripts to automatically fix the deficiencies in the updated technology files and/or the set of updated libraries when the customer uses the electronic design automation software (block 410).

Note that some embodiments of the present invention are based on the following insight: technology files and libraries often have the same types of deficiencies that need to be fixed.

Hence, if the update utility scripts are designed so that they are configurable, they can be quickly configured to fix the deficiencies for different foundries or third party library vendors. Additionally, the updates to the technology files and/or libraries may also contain deficiencies that are similar to those that were present in the original technology files and/or libraries. Hence, at least some portions of the update utilities can be re-used for fixing deficiencies in the updates to technology files and/or libraries. Additionally, as mentioned above, the update utilities are highly configurable so that when the EDA software vendor receives technology files for a different foundry, the EDA software vendor can use configurable templates to quickly generate update utilities for that particular foundry.

Accelerating Tape-Out

The EDA design flow can include a large number of configuration variables which are specifically designed to understand all of the different design parameters and analysis parameters that need to be checked to tape-out to the foundry. For example, the foundry may require that the customer run a timing analysis at four different operating corners, e.g., four different temperature and voltage corners. Configuration variables in the EDA design flow can allow a user to program these operating corners. Similarly, other parameters may be related to timing, power, design for test, manufacturability.

Figure 5:
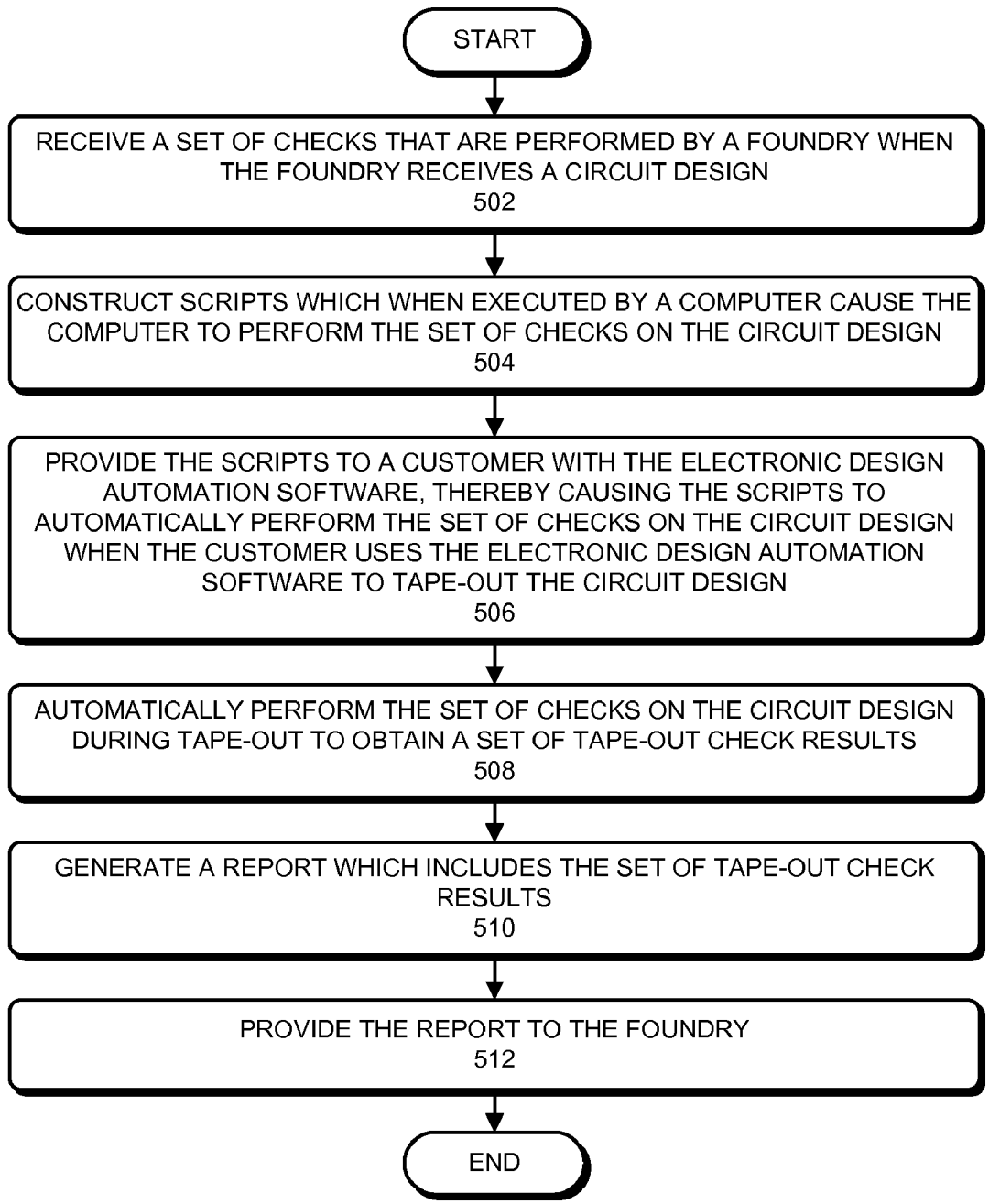
FIG. 5 presents a flowchart that illustrates a process to check a circuit design during tape-out in accordance with an embodiment of the present invention.

FIG. 5 presents a flowchart that illustrates a process to check a circuit design during tape-out in accordance with an embodiment of the present invention.

The process can begin by receiving a set of checks that are performed by a foundry when the foundry receives a circuit design (block 502). The checks can include netlist structure checks, formal verification checks, floorplan checks, library checks, static timing analysis checks, power integrity checks, signal integrity checks, and physical verification checks.

Next, the system can construct scripts which when executed by a computer cause the computer to perform the set of checks on the circuit design (block 504).

The system can then provide the scripts to a customer with the electronic design automation software, thereby causing the scripts to automatically perform the set of checks on the circuit design when the customer uses the electronic design automation software to tape-out the circuit design (block 506).

When the user uses the electronic design automation software, the system can automatically perform the set of checks on the circuit design during tape-out to obtain a set of tape-out check results (block 508). Alternatively, the customer can manually execute some or all of the scripts during tape-out to ensure that the taped-out circuit design (e.g., GDS-II data) meets the foundry's requirements.

Next, the system can generate a report which includes the set of tape-out check results (block 510). The circuit design can be modified if it fails one or more of the tape-out checks. Once the circuit design passes all of the checks, the circuit design can be taped-out, and the taped-out data can be provided to the foundry. In some embodiments, the system can provide the report to the foundry (block 512). Note that, the tape-out is accelerated because the customer ensures that the circuit design passes the tape-out check scripts before providing the taped-out circuit design to the foundry.

A foundry may perform its checks regardless of whether the customer has performed the tape-out checks or not. However, if the customer indicates that certain tape-out checks have been performed, the foundry can better prioritize its checks, e.g., the foundry may perform checks that the customer has not performed before it performs the checks that the customer has already performed.

In some embodiments, the EDA software may digitally sign the results of the tape-out checks. The customer may then present the digitally signed results to the foundry to prove that the tape-out checks were actually performed, and that the circuit design actually passed the tape-out checks.

Computer System

Figure 6:
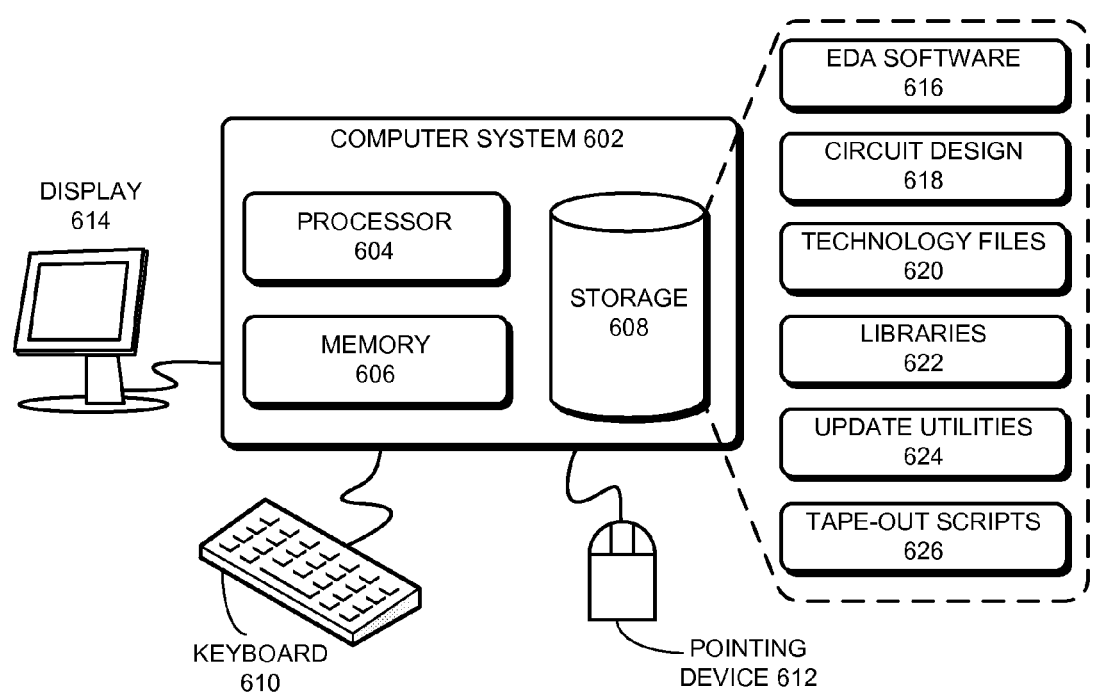
FIG. 6 illustrates a computer system in accordance with an embodiment of the present invention.

FIG. 6 illustrates a computer system in accordance with an embodiment of the present invention.

Computer system 602 comprises processor 604, memory 606, and storage 608. Computer system 602 can be coupled with display 614, keyboard 610, and pointing device 612. Storage 608 can store instructions and/or data that when processed by processor 604 can cause computer system 602 to help accelerate project start and tape-out.

Specifically, storage 608 can store EDA software 616, circuit design 618, technology files 620, libraries 622, update utilities 624, and tape-out scripts 626. During operation, EDA software 616 can be used to create circuit design 618, and technology files 620 and libraries 622 can be used during the circuit design process. Specifically, EDA software 616 can use update utilities 624 to fix any deficiencies in technology files 620 and libraries 622. Once the design is ready to be taped-out, EDA software 616 can execute tape-out scripts 626 to check whether circuit design 618 satisfies the foundry's requirements. The modules shown in FIG. 6 are for illustrative purposes only and are not intended to limit the invention to the forms disclosed.

CONCLUSION

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method to accelerate project start for a circuit design project which uses electronic design automation software, the method comprising:
   receiving a set of technology files and a set of libraries, which are intended for use with a specific semiconductor manufacturing technology;
   identifying deficiencies in the set of technology files and the set of libraries;
   constructing, by computer, scripts that when executed by a computer system cause the computer system to fix the deficiencies in the technology files and the set of libraries, wherein the deficiencies include at least one design-rule violation, and wherein constructing scripts involves configuring script templates using parameter values that are associated with the specific semiconductor manufacturing technology; and
   providing the scripts to the customer with the electronic design automation software, thereby causing the scripts to automatically fix the deficiencies in the technology files and the set of libraries when the customer uses the electronic design automation software.

2. The method of claim 1, wherein the technology files describe parameters for a semiconductor manufacturing technology, and wherein the libraries include pre-designed cells.

3. The method of claim 1, wherein the script is a Tcl/Tk script.

4. The method of claim 1, wherein the technology files are received from a foundry which is expected to manufacture chips based on the circuit design, and wherein the set of libraries are received from a third party library vendor.

5. The method of claim 1, further comprising:
   receiving an update to the set of technology files;
   applying the update to the set of technology files to obtain a set of updated technology files;
   identifying deficiencies in the set of updated technology files;
   updating the scripts based on the deficiencies in the set of updated technology files to obtain updated scripts that when executed by the computer system cause the computer system to fix deficiencies in the set of updated technology files; and
   providing the updated scripts to the customer, thereby causing the updated scripts to automatically fix the deficiencies in the updated technology files when the customer uses the electronic design automation software.

6. The method of claim 1, further comprising:
   receiving an update to the set of libraries;
   applying the update to the set of libraries to obtain a set of updated libraries;
   identifying deficiencies in the set of updated libraries;
   updating the scripts based on the deficiencies in the set of updated libraries to obtain updated scripts that when executed by the computer system cause the computer system to fix deficiencies in the set of updated libraries; and
   providing the updated scripts to the customer, thereby causing the updated scripts to automatically fix the deficiencies in the updated libraries when the customer uses the electronic design automation software.

7. A non-transitory computer-readable storage medium storing instructions that when executed by a computer cause the computer to perform a method to accelerate project start for a circuit design project which uses electronic design automation software, the method comprising:
   receiving a set of technology files and a set of libraries which are intended for use with a specific semiconductor manufacturing technology;
   identifying deficiencies in the set of technology files and the set of libraries;
   constructing scripts that when executed by a computer system cause the computer system to fix the deficiencies in the technology files and the set of libraries, wherein the deficiencies include at least one design-rule violation, and wherein constructing scripts involves configuring script templates using parameter values that are associated with the specific semiconductor manufacturing technology; and
   providing the scripts to the customer with the electronic design automation software, thereby causing the scripts to automatically fix the deficiencies in the technology files and the set of libraries when the customer uses the electronic design automation software.

8. The computer-readable storage medium of claim 7, wherein the technology files describe parameters for a semiconductor manufacturing technology, and wherein the libraries include pre-designed cells.

9. The computer-readable storage medium of claim 7, wherein the script is a Tcl/Tk script.

10. The computer-readable storage medium of claim 7, wherein the technology files are received from a foundry which is expected to manufacture chips based on the circuit design, and wherein the set of libraries are received from a third party library vendor.

11. The computer-readable storage medium of claim 7, wherein the method further comprises:
   receiving an update to the set of technology files;
   applying the update to the set of technology files to obtain a set of updated technology files;
   identifying deficiencies in the set of updated technology files;
   updating the scripts based on the deficiencies in the set of updated technology files to obtain updated scripts that when executed by the computer system cause the computer system to fix deficiencies in the set of updated technology files; and
   providing the updated scripts to the customer, thereby causing the updated scripts to automatically fix the deficiencies in the updated technology files when the customer uses the electronic design automation software.

12. The computer-readable storage medium of claim 7, wherein the method further comprises:
   receiving an update to the set of libraries;
   applying the update to the set of libraries to obtain a set of updated libraries;
   identifying deficiencies in the set of updated libraries;
   updating the scripts based on the deficiencies in the set of updated libraries to obtain updated scripts that when executed by the computer system cause the computer system to fix deficiencies in the set of updated libraries; and
   providing the updated scripts to the customer, thereby causing the updated scripts to automatically fix the deficiencies in the updated libraries when the customer uses the electronic design automation software.

13. A method to accelerate tape-out of a circuit design, wherein the circuit design is designed and taped-out using electronic design automation software, the method comprising:
   receiving a set of checks that are performed by a foundry;
   constructing, by computer, scripts that when executed by a computer cause the computer to perform the received set of checks on the circuit design, wherein constructing scripts involves configuring script templates using parameter values that are associated with a specific semiconductor manufacturing technology used by the foundry; and providing the scripts to a customer with the electronic design automation software, thereby causing the scripts to automatically perform the set of checks on the circuit design when the customer uses the electronic design automation software to tape-out the circuit design.

14. The method of claim 13, further comprising:

automatically performing the set of checks on the circuit design during tape-out to obtain a set of tape-out check results;

generating a report which includes the set of tape-out check results; and providing the report to the foundry.

15. The method of claim 13, wherein the set of checks includes:

netlist structure checks;
formal verification checks;
floorplan checks;
library checks;
static timing analysis checks;
power integrity checks;
signal integrity checks; and
physical verification checks.

16. A non-transitory computer-readable storage medium storing instructions that when executed by a computer cause the computer to perform a method to accelerate tape-out of a circuit design, wherein the circuit design is designed and taped-out using electronic design automation software, the method comprising:

receiving a set of checks that are performed by a foundry;

constructing scripts which when executed by a computer cause the computer to perform the received set of checks on the circuit design, wherein constructing scripts involves configuring script templates using parameter values that are associated with a specific semiconductor manufacturing technology used by the foundry; and providing the scripts to a customer with the electronic design automation software, thereby causing the scripts to automatically perform the set of checks on the circuit design when the customer uses the electronic design automation software to tape-out the circuit design.

17. The computer-readable storage medium of claim 16, wherein the method further comprises:

automatically performing the set of checks on the circuit design during tape-out to obtain a set of tape-out check results;

generating a report which includes the set of tape-out check results; and providing the report to the foundry, thereby accelerating tape-out of the circuit design.

18. The computer-readable storage medium of claim 16, wherein the set of checks includes:

netlist structure checks;
formal verification checks;
floorplan checks;
library checks;
static timing analysis checks;
power integrity checks;
signal integrity checks; and
physical verification checks.

* * * * *